United States Patent
Roh et al.

(10) Patent No.: US 6,602,649 B2
(45) Date of Patent: Aug. 5, 2003

(54) PHOTORESIST MONOMERS, POLYMERS THEREOF AND PHOTORESIST COMPOSITIONS CONTAINING THE SAME

(75) Inventors: Chi Hyeong Roh, Kyoungki-do (KR); Seung Hyuk Lee, Kyoungki-do (KR); Chan Seob Cho, Kyoungki-do (KR)

(73) Assignee: Hynix Semiconductor Inc, Kyoungki (KR)

( * ) Notice: Subject to any disclaimer, the term of this patent is extended or adjusted under 35 U.S.C. 154(b) by 225 days.

(21) Appl. No.: 09/882,191

(22) Filed: Jun. 15, 2001

(65) Prior Publication Data
US 2002/0015912 A1 Feb. 7, 2002

(30) Foreign Application Priority Data

Jun. 15, 2000 (KR) ........................................ 2000-32983

(51) Int. Cl.[7] .............................................. G03F 7/004
(52) U.S. Cl. ..................... 430/270.1; 430/325; 430/330; 430/296; 430/327; 548/416
(58) Field of Search ............................ 430/270.1, 325, 430/330, 296, 327; 548/416

(56) References Cited

U.S. PATENT DOCUMENTS

| | | | | |
|---|---|---|---|---|
| 3,988,299 A | * | 10/1976 | Malofsky ..................... | 260/49 |
| 4,808,638 A | * | 2/1989 | Steinkraus et al. ............ | 522/24 |
| 6,406,828 B1 | * | 6/2002 | Szmanda et al. ......... | 430/270.1 |
| 2002/0012869 A1 | * | 1/2002 | Adams et al. ............ | 430/270.1 |
| 2002/0013448 A1 | * | 1/2002 | Barclay et al. ............. | 528/271 |
| 2002/0055060 A1 | * | 5/2002 | Taylor et al. ............ | 430/270.1 |
| 2002/0173680 A1 | * | 11/2002 | Szmanda et al. ........... | 568/825 |
| 2003/0044716 A1 | * | 3/2003 | Cameron et al. ........ | 430/270.1 |

* cited by examiner

Primary Examiner—Janet Baxter
Assistant Examiner—Amanda C. Walke
(74) Attorney, Agent, or Firm—Marshall, Gerstein & Borun

(57) ABSTRACT

Photoresist monomers which can be used to form photoresist polymers and photoresist compositions using the same which are suitable for photolithography processes employing a deep ultraviolet light source and copolymers thereof. Monomers are represented by following Formula 1:

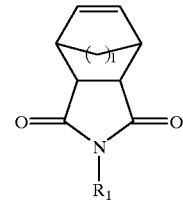

Formula 1 wherein, $R_1$, is —OH or —R—OH;

R represents substituted or unsubstituted linear or branched ($C_1$–$C_{10}$) alkylene, substituted or unsubstituted ($C_1$–$C_{10}$) alkylene comprising an ether linkage, substituted or unsubstituted ($C_1$–$C_{10}$) alkylene comprising an ester linkage, or substituted or unsubstituted ($C_1$–$C_{10}$) alkylene comprising an ketone moiety; and 1 is an integer of 1 or 2.

26 Claims, 3 Drawing Sheets

PHOTORESIST MONOMERS, POLYMERS THEREOF AND PHOTORESIST COMPOSITIONS CONTAINING THE SAME

BACKGROUND OF THE INVENTION

1. Technical Field

Photoresist monomers, polymers derived from the same and photoresist compositions comprising the polymers are discussed. In particular, photoresist monomers, polymers derived from the same and photoresist compositions comprising the polymers that are suitable for photolithography processes using DUV (deep ultraviolet light sources) are disclosed.

2. Description of the Background Art

Recently, chemical amplification type DUV photoresists have been investigated in order to achieve high sensitivity in minute image formation processes for preparing semiconductor devices. Such photoresists are prepared by blending a photoacid generator and matrix resin polymer having an acid labile group.

According to the reaction mechanism of such a photoresist, the photoacid generator generates acid when it is illuminated by a light source, and the main chain or branched chain of the resin is reacted with the generated acid to be decomposed or crosslinked. The polarity change of the resin induces solubility differences between the exposed portion and unexposed portion in the developing solution, to form a predetermined pattern.

In the lithography process, resolution depends upon the wavelength of the light source; the shorter the wavelength, the more minute pattern can be formed.

In general, a photoresist (hereinafter, abbreviated to as "PR") must satisfy various requisites such as low absorbance to the light source, excellent etching resistance, heat resistance and adhesiveness, and more preferably, it should be developable in 2.38 wt % aqueous tetramethylammonium hydroxide (TMAH) solution. However, it is very difficult to synthesize a polymer that satisfies all of these requisites. For example, a polymer having a polyacrylate main chain can be easily synthesized, but it has poor etching resistance and has difficulties in the developing process. In order to secure etching resistance, adding an alicyclic unit to the main chain has been considered. However, in this case, it is very difficult to form a copolymer wherein the main chain is comprised entirely of alicyclic units.

As an attempt to solve the problems described above, Bell Research Center developed a polymer having the following chemical structure, wherein the main chain is substituted with norbornylene, acrylate and maleic anhydride units.

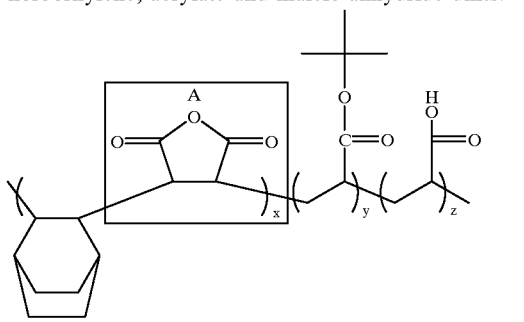

However, the above polymer has a problem in that the maleic anhydride moiety ('A' portion), which is employed to polymerize alicyclic olefin groups, is readily dissolved in 2.38 wt % aqueous TMAH solution even in an unexposed condition. Thus, in order to inhibit the dissolution of the polymer in the unexposed section, the ratio of 'Y' portion having tert-butyl substituent should be increased, but this results in a relative decrease of the 'Z' portion (which has a role of increasing adhesiveness to the substrate), and therefore the PR might be easily separated from the substrate at the time of patterning.

In order to solve the problem, cholesterol type dissolution inhibitors have been added to the polymer to form a two-component system. However, since the amount of the dissolution inhibitor is very high (about 30%(w/w) of the resin), reappearance is low and the production cost is high, thereby making the system unsuitable as a PR.

SUMMARY OF THE DISCLOSURE

Novel PR monomers are disclosed that can form polymers having excellent etching resistance, adhesiveness and photosensitivity, and can be manufactured on a large scale at a low production cost.

PR polymers having excellent etching resistance, adhesiveness and photosensitivity, and a process for preparing the same are also disclosed.

Photoresist compositions using the PR polymers described above, and a process for preparing the same are also disclosed.

A semiconductor element produced using the photoresist composition is also disclosed.

DETAILED DESCRIPTION OF THE PRESENTLY PREFERRED EMBODIMENTS

Figure 1:
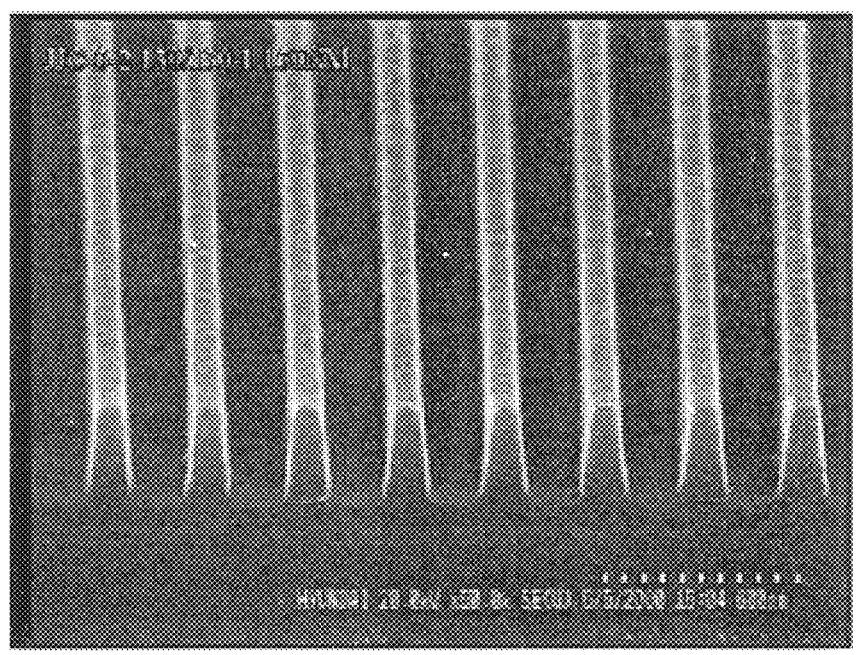
FIG. 1 illustrates a photoresist pattern obtained from Example 9.

Novel photoresist monomers, which achieve the above stated objectives, and a process for preparing the same will be described below. Photoresist polymers derived from such photoresist monomers, and a process for preparing the same will also be disclosed. In addition, photoresist compositions comprising such photoresist polymers, and a semiconductor device manufactured by using such photoresist compositions will also be disclosed.

A novel photoresist monomer has the following Formula 1:

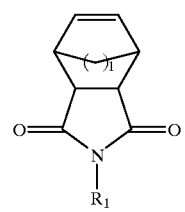

Formula 1 wherein, $R_1$ is 13 OH or —R—OH;

R represents substituted or unsubstituted linear or branched (C1–C10) alkylene, substituted or unsubstituted (C1–C10) alkylene comprising an ether linkage, substituted or unsubstituted (C1–C10) alkylene comprising an ester linkage, or substituted or unsubstituted (C1–C10) alkylene comprising an ketone moiety; and 1 is an integer of 1 or 2.

Preferably, the monomer is N-hydroxy-5-norbornene-2,3-dicarboxylic imide of following formula 1a, or N-hydroxy cis-bicyclo[2.2.2]oct-5-ene-2-tert-butyl carboxylic imide of following formula 1b:

Formula 1a

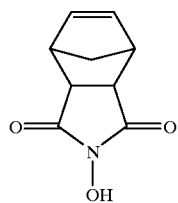

Formula 1b

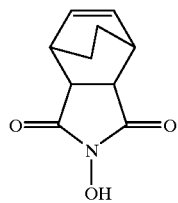

In addition, a novel photoresist copolymer contains a repeating unit obtained by additional copolymerization of (i) the compound of above Formula 1 as a first monomer; and (ii) a compound of following Formula 2 as a second monomer:

Formula 2

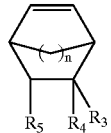

wherein, $R_2$ is an acid labile protecting group; and m is an integer of 1 or 2.

The acid labile protecting group can be any of known protecting groups that can be substituted by an acid and functions to prevent the compound to which the group is bound from dissolving in the alkaline developer solution. Conventional acid labile protecting groups are disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0789 278 (Aug. 13, 1997) and U.S. Pat. No. 6,132,926 (Oct. 17, 2000). Preferable acid labile protecting groups are selected from the group consisting of tert-butyl, tetrahydropyran-2-yl, 2-methyl tetrahydropyran-2-yl, tetrahydrofuran-2-yl, 2-methyl tetrahydrofuran-2-yl, 1-methoxypropyl, 1-methoxy-1-methylethyl, 1-ethoxypropyl, 1-ethoxy-1-methylethyl, 1-methoxyethyl, 1-ethoxyethyl, tert-butoxyethyl, 1-isobutoxyethyl and 2-acetylmenth-1-yl.

The repeating unit can further contain at least one monomer selected from the group consisting of maleic anhydride and maleimide derivative as a third monomer; and at least one monomer selected from the group consisting of compounds of following formulas 3 and 4 as a fourth monomer:

Formula 3

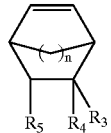

wherein, $R_3$ is selected from the group consisting of—OH, —R—OH and —COOH;

$R_4$ represents H, —OH or —R—OH;

R represents substituted or unsubstituted linear or branched ($C_1$–$C_{10}$) alkylene, substituted or unsubstituted ($C_1$–$C_{10}$) alkylene comprising an ether linkage, substituted or unsubstituted ($C_1$–$C_{10}$) alkylene comprising an ester linkage, or substituted or unsubstituted ($C_1$–$C_{10}$) alkylene comprising an ketone moiety;

$R_5$ represents H, or substituted or unsubstituted —COO—R*;

R* represents H, or substituted or unsubstituted linear or branched ($C_1$–$C_{10}$) alkyl; and n is an integer of 1 or 2.

Formula 4 wherein, $R_6$ and $R_7$ are independently substituted or unsubstituted linear or branched ($C_1$–$C_{10}$) alkylene, substituted or unsubstituted ($C_1$–$C_{10}$) alkylene comprising an ether linkage, substituted or unsubstituted ($C_1$–$C_{10}$) alkylene comprising an ester linkage, or substituted or unsubstituted ($C_1$–$C_{10}$) alkylene comprising an ketone moiety.

Preferably, molecular weight of the present photoresist copolymer is from about 3,000 to about 100,000.

The preferred repeating unit include:

Poly(N-hydroxy-5-norbornene-2,3-dicarboxylic imide/tert-butyl 5-norbornene-2-carboxylate/maleic anhydride/mono-methyl cis-5-norbornene-endo-2,3-dicarboxylate/dibutyl malate) of Formula 5:

Formula 5

Poly(N-hydroxy-5-norbornene-2,3-dicarboxylic imide/tert-butyl 5-norbornene-2-carboxylate/maleic anhydride/ mono-methyl-bicyclo[2.2.2]oct-5-ene-2,3-dicarboxylate/
dibutyl malate) of Formula 6:

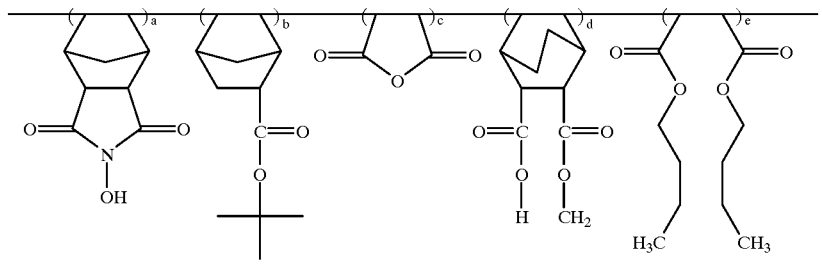

Formula 6

Poly(N-hydroxy-5-norbornene-2,3-dicarboxylic imide/
tert-butyl 5-norbornene-2-carboxylate/maleic anhydride/5-
norbornene-2,2-dimethanol dibutyl malate) of Formula 7:

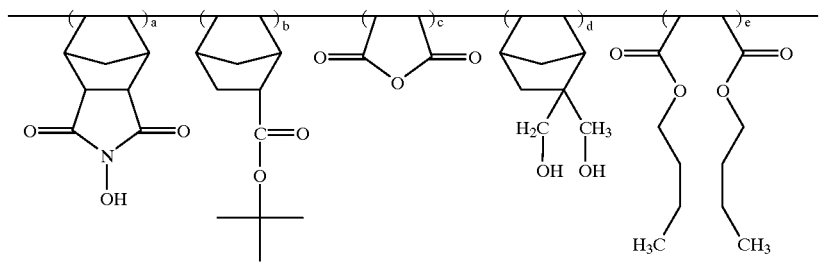

Formula 7

Poly(N-hydroxy-5-norbornene-2,3-dicarboxylic imide/
tert-butyl 5-norbornene-2-carboxylate/maleic anhydride/5-
norbornene-2-methanol/dibutyl malate) of Formula 8:

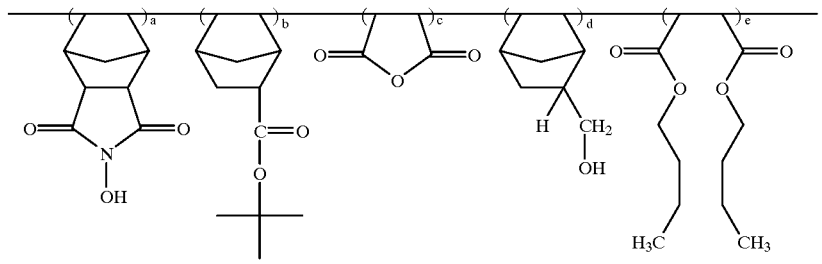

Formula 8

Poly(N-hydroxy-5-norbornene-2,3-dicarboxylic imide/
tert-butyl 5-norbornene-2-carboxylate/maleic anhydride/5-
norbornene-2-ol/dibutyl malate) of Formula 9:

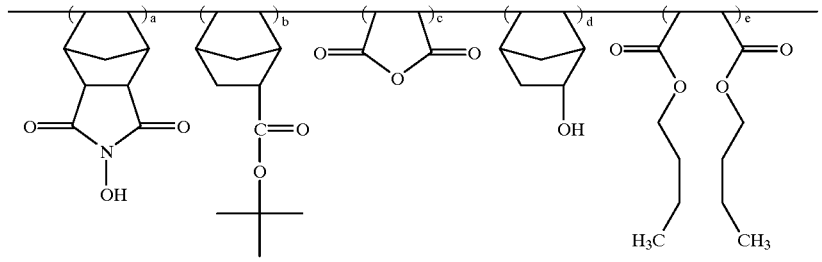

Formula 9

Poly(N-hydroxy cis-bicyclo[2.2.2]oct-5-ene-2,3-dicarboxylic imide/bicyclo [2.2.2]oct-5-ene-2-tert-butylcarboxylate/maleic anhydride/bicyclo [2.2.2]oct-5-ene-2,2-dimethanol/dibutyl malate) of Formula 10:

Formula 10

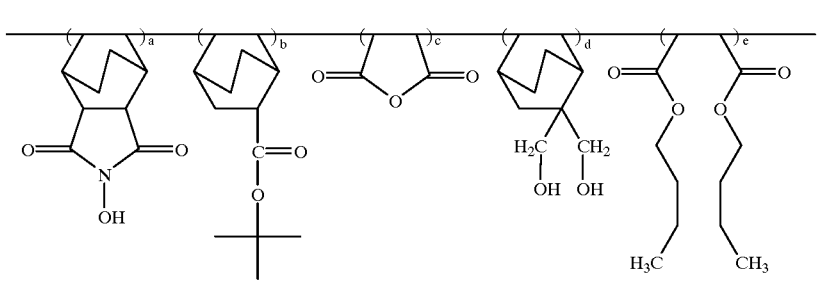

Poly(N-hydroxy cis-bicyclo[2.2.2]oct-5-ene-2,3-dicarboxylic imide/bicyclo [2.2.2]oct-5-ene-2-tert-butylcarboxylate/maleic anhydride/bicyclo [2.2.2]oct-5-ene-2-methanol/dibutyl malate) of Formula 11:

Formula 11

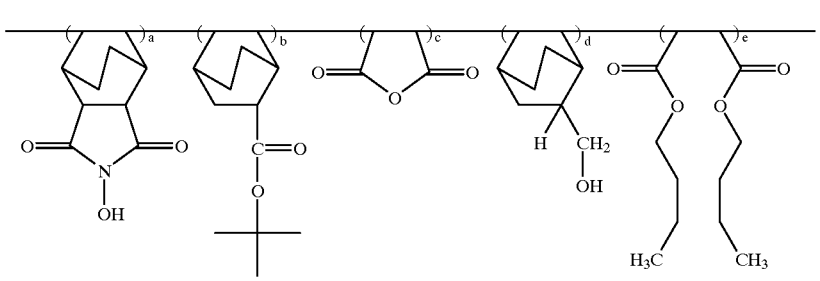

And poly(N-hydroxy cis-bicyclo[2.2.2]oct-5-ene-2,3-dicarboxylic imide/bicyclo [2.2.2]oct-5-ene-2-tert-butylcarboxylate/maleic anhydride/bicyclo [2.2.2]oct-5-ene-2-ol/dibutyl malate) of Formula 12:

Formula 12

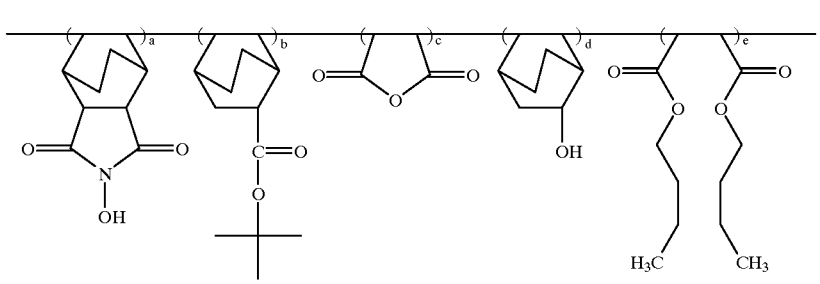

Copolymers can be prepared by any of the methods known to one of ordinary skill in the art [some of them are disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0789 278 (Aug. 13, 1997) and U.S. Pat. No. 6,132,926 (Oct 17, 2000)], including by radical additional polymerization of monomers with a conventional radical polymerization initiator, and by polymerization with a metal catalyst.

In the polymerization process using the polymerization initiator, the aforementioned monomers are dissolved in a general organic solvent in the existence of the polymerization initiator. Here, at least one of maleic anhydride and maleic anhydride derivatives is added to obtain an appropriate polymerization yield.

Exemplary organic solvents suitable for polymerization preferably include tetrahydrofuran, dimethyl formamide, dimethyl sulfoxide, dioxane, methyl ethyl ketone, benzene, toluene and xylene.

Exemplary polymerization initiator include any conventional radical polymerization initiators such as 2,2'-azobisisobutyronitrile (AIBN), acetyl peroxide, lauryl peroxide and tert-butyl peroxide.

On the other hand, the polymerization process using the metal catalyst can be performed by any of the methods known to one of ordinary skill in the art, but can obtain an appropriate polymerization yield without using maleic anhydride or maleimide.

An exemplary metal catalyst is allyl palladium chloride.

A novel photoresist composition comprises: a photoresist copolymer described herein, a photoacid generator, and an organic solvent.

Any of known photoacid generator, which is able to generate acids by light, can be used in PR composition of the present invention. Conventional photoacid generators are disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0789 278 (Aug. 13, 1997) and U.S. Pat. No. 6,132,926 (Oct. 17, 2000). Preferred photoacid generators is selected from the group consisting of diphenyl iodide hexafluorophosphate, diphenyl iodide hexafluoroarsenate, diphenyl iodide hexafluoroantimonate, diphenyl p-methoxyphenyl triflate, diphenyl p-toluenyl triflate, diphenyl p-isobutylphenyl triflate, diphenyl p-tert-butylphenyl triflate, triphenylsulfonium hexafluororphosphate, triphenylsulfonium hexafluoroarsenate, triphenylsulfonium hexafluoroantimonate, triphenylsulfonium triflate and dibutylnaphthylsulfonium triflate.

The photoacid generator is used in an amount of 0.1 to 10 wt % of the photoresist polymer employed. It has been found that when the photoacid generator is used in the amount less than about 0.1 wt %, it lowers photosensitivity of the photoresist composition, and when the photoacid generator is used in the amount greater than about 10%, it results in poor pattern formation due to its high absorption of DUV.

Organic solvent can be any of known solvent disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0789 278 (Aug. 13, 1997) and U.S. Pat. No. 6,132,926 (Oct. 17, 2000). Preferable organic solvents in PR compositions of the present invention include ethyl 3-ethoxypropionate, methyl 3-methoxypropionate, cyclohexanone, and propyleneglycol methyl ether acetate. The amount of solvent used is preferably in the range of from about 200 to 1000% by weight of the photoresist polymer. This ratio has been found to be particularly useful in obtaining a photoresist layer of desirable thickness. In particular, it has been found by the present inventors that when the amount of organic solvent is about 600% by weight of the photoresist copolymer, a photoresist layer having 0.5 $\mu$m of thickness can be obtained.

In addition, a process for forming a photoresist pattern comprises:
(a) coating the photoresist composition described above on a substrate of semiconductor element to form a photoresist film;
(b) exposing the photoresist film to light using light source; and
(c) developing the exposed photoresist film.

Optionally, the photoresist film can be heated (i.e., baked) before and/or after the step (b).

The photoresist composition is spin-coated on a silicon wafer to form a thin film. The thin film is soft-baked in an oven or hot plate for a time period ranging from about 1 to about 5 minutes at a temperature ranging from about 70 to about 200° C., more preferably a temperature ranging from about 80 to about 150°; exposed to light generated by a DUV exposer or excimer laser exposer; and post-baked at a temperature ranging from about 10 to about 200° C., more preferably a temperature ranging from about 100 to about 200° C. Preferably, the irradiation energy ranges from about 0.1 to about 30 mJ/cm$^2$.

Thereafter, the wafer is dipped for about 90 seconds in 2.38 wt % aqueous TMAH solution to be developed. As a result, an ultrafine positive resist image is formed.

Exemplary light sources which are useful for forming the photoresist pattern include the light source having wavelength below 250 nm, such as ArF(193 nm), KrF(248 nm), F$_2$(157 nm), EUV(13 nm), E-beam, X-ray and ion beam.

A semiconductor element, which is manufactured according to the process for forming the pattern as described above is disclosed.

Additional objects, advantages, and novel features will become apparent to those skilled in the art upon examination of the following examples thereof, which are not intended to be limiting.

I. Preparation of Photoresist Copolymers

EXAMPLE 1

Preparation of Poly(N-hydroxy-5-norbornene-2,3-dicarboxylic imide/tert-butyl 5-norbornene-2-carboxylate/maleic anhydride/mono-methyl cis-5-norbornene-endo-2,3-dicarboxylate/dibutyl malate)

To tetrahydrofuran (THF) was added 1.0 mole of maleic anhydride, 0.2 mole of N-hydroxy-5-norbornene-2,3-dicarboxylic imide, 0.15 mole of mono-methyl cis-5-norbornene-endo-2,3-dicarboxylate, 0.5 mole of tert-butyl 5-norbornene-2-carboxylate, and 0.15 mole of dibutyl malate. 0.5 to 10 g of polymerization initiator, AIBN was added to the resultant solution, and reacted at a temperature ranging from about 60 to about 70° C. for a time period ranging from about 4 to about 24 hours in nitrogen or argon atmosphere. The generated polymer was precipitated in ethyl ether or hexane, and dried, to obtain the compound of Formula 5.

EXAMPLE 2

Preparation of Poly(N-hydroxy-5-norbornene-2,3-dicarboxylic imide/tert-butyl 5-norbornene-2-carboxylate/maleic anhydride/mono-methyl-bicyclo [2.2.2]oct-5-ene-2,3-dicarboxylate/dibutyl malate)

The procedure of Example 1 was repeated but using 0.15 mole of mono-methyl-bicyclo [2.2.2]oct-5-ene-2,3-dicarboxylate, instead of 0.15 mole of mono-methyl cis-5-norbornene-endo-2,3-dicarboxylate, thereby obtaining the compound of Formula 6.

EXAMPLE 3

Preparation of Poly(N-hydroxy-5-norbornene-2,3-dicarboxylic imide/tert-butyl 5-norbornene-2-carboxylate/maleic anhydride/5-norbornene-2,2-dimethanol/dibutyl malate)

To tetrahydrofuran(THF) was added 1.0 mole of maleic anhydride, 0.2 mole of cis-5-norbornene-endo-2,3-dicarboxylic anhydride, 0.1 mole of 5-norbornene-2,2-dimethanol, 0.5 mole of tert-butyl 5-norbornene-2-carboxylate, and 0.2 mole of dibutyl malate. 0.5 to 10 g of polymerization initiator, AIBN was added to the resultant solution, and reacted at a temperature ranging from about 60 to about 70° C. for a time period ranging from about 4 to about 24 hours in nitrogen or argon atmosphere. The generated polymer was precipitated in ethyl ether or hexane, and dried, to obtain the compound of Formula 7.

EXAMPLE 4

Preparation of Poly(N-hydroxy-5-norbornene-2,3-dicarboxylic imide/tert-butyl 5-norbornene-2-carboxylate/maleic anhydride/5-norbornene-2-methanol/dibutyl malate)

The procedure of Example 3 was repeated but using 0.1 mole of 5-norbornene-2-methanol, instead of 0.1 mole of 5-norbornene-2,2-dimethanol, thereby obtaining the compound of Formula 8.

EXAMPLE 5

Preparation of Poly(N-hydroxy-5-norbornene-2,3-dicarboxylic imide/tert-butyl 5-norbornene-2-carboxylate/maleic anhydride/5-norbornene-2-ol/dibutyl malate)

The procedure of Example 3 was repeated but using 0.1 mole of 5-norbornene-2-ol, instead of 0.1 mole of 5-norbornene-2,2-dimethanol, thereby obtaining the compound of Formula 9.

EXAMPLE 6

Preparation of Poly(N-hydroxy cis-bicyclo [2.2.2] oct-5-ene-2,3-dicarboxylic imide/bicyclo[2.2.2]oct-5-ene-2-tert-butylcarboxylate/maleic anhydride/ bicyclo [2.2.2]oct-5-ene-2,2-dimethanol/dibutyl malate)

The procedure of Example 3 was repeated but using 0.1 mole of bicyclo [2.2.2]oct-5-ene-2,2-dimethanol, instead of 0.1 mole of 5-norbornene-2,2-dimethanol, using 0.2 mole of N-hydroxy cis-bicyclo [2.2.2]oct-5-ene-2,3-dicarboxylic imide, instead of N-hydroxy-5-norbornene-2,3-dicarboxylic imide, and using 0.5 mole of bicyclo [2.2.2]oct-5-ene-2-tert-butylcarboxylate, instead of tert-butyl 5-norbornene-2-carboxylate, thereby obtaining the compound of Formula 10.

EXAMPLE 7

Preparation of Poly(N-hydroxy cis-bicyclo [2.2.2] oct-5-ene-2,3-dicarboxylic imide/bicyclo[2.2.2]oct-5-ene-2-tert-butylcarboxylate/maleic anhydride/ bicyclo[2.2.2]oct-5-ene-2-methanol/dibutyl malate)

The procedure of Example 6 was repeated but using 0.1 mole of bicyclo [2.2.2]oct-5-ene-2-methanol, instead of 0.1 mole of bicyclo [2.2.2]oct-5-ene-2,2-dimethanol, thereby obtaining the compound of Formula 11.

EXAMPLE 8

Preparation of Poly(N-hydroxy cis-bicyclo [2.2.2] oct-5-ene-2,3-dicarboxylic imide/bicyclo [2.2.2]oct-5-ene-2,3-dicarboxylic imide/bicyclo[2.22]oct-5-ene-2-tert-butylcarboxylate/malate anhydride/ bicyclo[2.2.2]oct-5-ene-2-ol/dibutyl malate)

The procedure of Example 6 was repeated but using 0.1 mole of bicyclo [2.2.2]oct-5-ene-2-ol, instead of 0.1 mole of bicyclo [2.2.2]oct-5-ene-2,2-dimethanol, thereby obtaining the compound of Formula 12.

II. Preparation of Photoresist Composition and Formation of Pattern

EXAMPLE 9

The photoresist polymer of Formula 5 prepared in Example 1 (10 g) and triphenylsulfonium triflate or dibutylnaphthylsulfonium triflate (0.01 to 1 g) were added to 3-methoxymethylpropionate solvent (40 g), and the resultant mixture was stirred and filtered through a 0.10 μm filter to prepare a photoresist composition.

The photoresist composition thus prepared was coated on a silicon wafer at a thickness of about 0.6 μm, to form a photoresist film, and soft-baked for a time period ranging from about 1 to about 5 minutes in an oven or hot plate of a temperature ranging from about 80 to about 150° C. After baking, the photoresist was exposed to light by using an ArF laser exposer, and post-baked at a temperature ranging from about 100 to about 200° C. Thereafter, the photoresist film was developed in 2.38 wt % aqueous TMAH solution for about 90seconds, to obtain a 0.15 μm L/S pattern (see FIG. 1).

EXAMPLE 10

Figure 2:
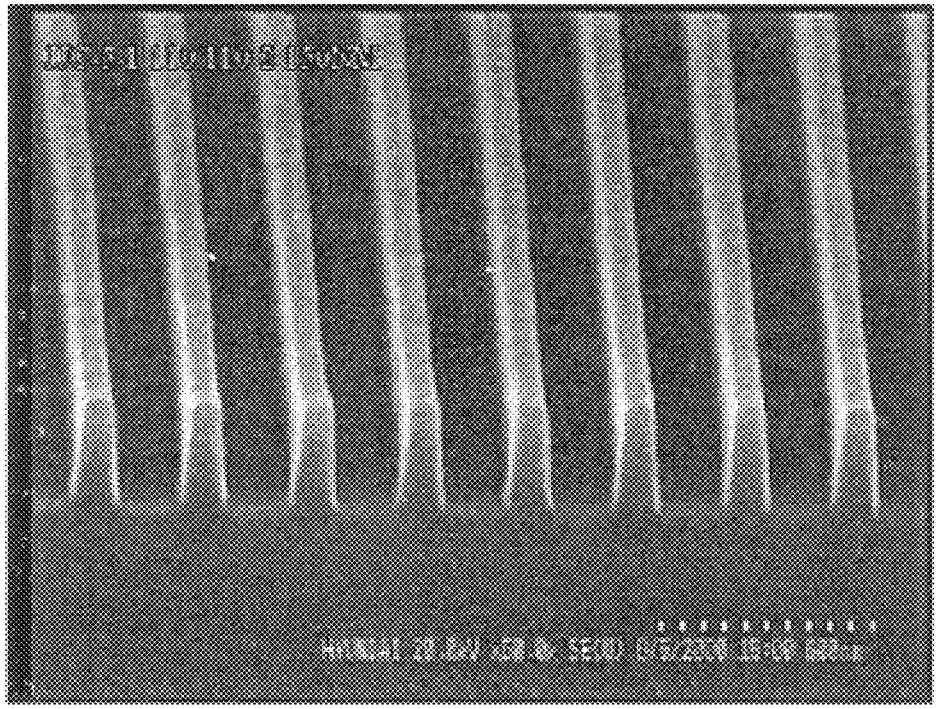
FIG. 2 illustrates a photoresist pattern obtained from Example 10.

The procedure of Example 9 was repeated but using the photoresist polymer of formula 6 prepared in Example 2, instead of the photoresist polymer prepared in Example 1, thereby obtaining a 0.15 μm L/S pattern (see FIG. 2).

EXAMPLE 11

Figure 3:
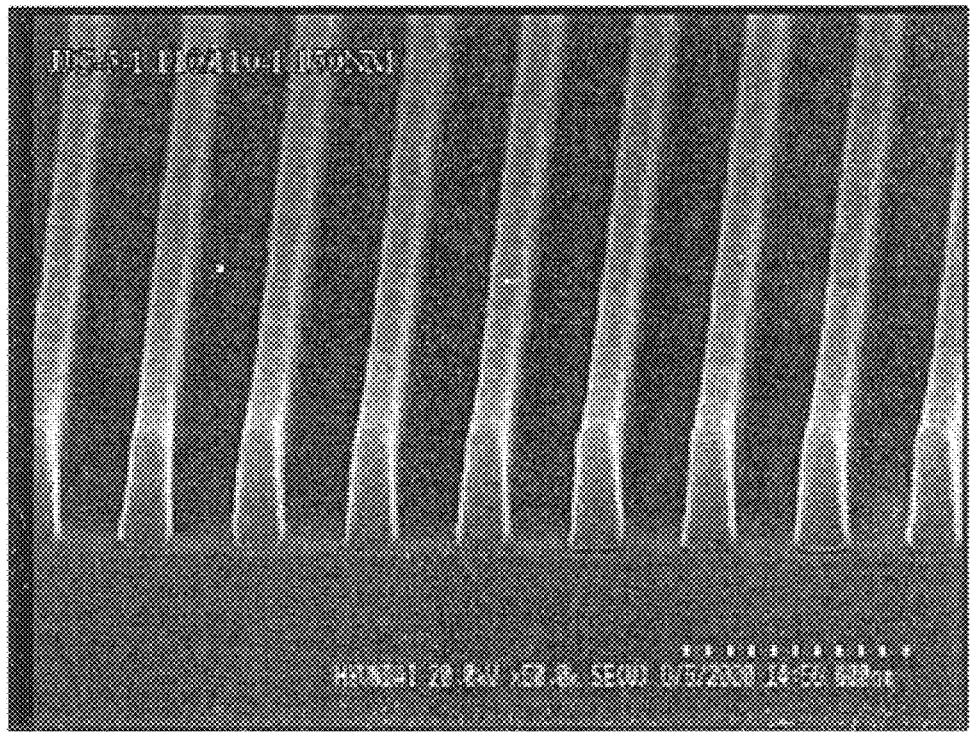
FIG. 3 illustrates a photoresist pattern obtained from Example 11.

The procedure of Example 9 was repeated but using the photoresist polymer of formula 7 prepared in Example 3, instead of the photoresist polymer prepared in Example 1, thereby obtaining a 0.15 μm vertical L/S pattern (see FIG. 3).

As discussed above, the photoresist composition containing the photoresist polymers have excellent etching resistance, heat resistance and adhesiveness, is developable in 2.38 wt % aqueous TMAH solution, and thus suitable for an ArF photoresist film. As a result, a semiconductor device having improved reliability can be manufactured by using the photoresist compositions.

The foregoing discussion has been presented for purposes of illustration and description. The foregoing is not intended to limit the disclosure to the form or forms disclosed herein. Although the description has included description of one or more embodiments and certain variations and modifications, other variations and modifications are within the scope of the disclosure, e.g., as may be within the skill and knowledge of those in the art, after understanding the disclosure. It is intended to obtain rights which include alternative embodiments to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed:

1. A photoresist monomer represented by following Formula 1:

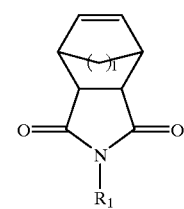

Formula 1 wherein, $R_1$ is —OH or —R—OH;

R is selected from the group consisting of $(C_1-C_{10})$ alkylene, $(C_1-C_{10})$ alkylene comprising an ether linkage, $(C_1-C_{10})$ alkylene comprising an ester linkage, and $(C_1-C_{10})$ alkylene comprising an ketone moiety; and 1 is an integer of 1 or 2.

2. The photoresist monomer of claim 1, wherein the monomer is N-hydroxy-5-norbornene-2,3-dicarboxylic imide, or N-hydroxy cis-bicyclo [2.2.2]oct-5-ene-2-tert-butyl carboxylic imide.

3. A photoresist copolymer, comprising a repeating unit obtained by additional polymerization of:

(i) a compound of following Formula 1 as a first monomer; and (ii) a compound of following Formula 2 as a second monomer:

Formula 1

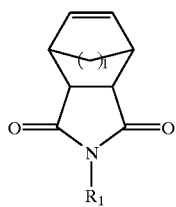

wherein, $R_1$ is —OH or —R—OH;

R is selected from the group consisting of ($C_1$–$C_{10}$) alkylene, ($C_1$–$C_{10}$) alkylene comprising an ether linkage, ($C_1$–$C_{10}$) alkylene comprising an ester linkage, and ($C_1$–$C_{10}$) alkylene comprising an ketone moiety; and l is an integer of 1 or 2;

Formula 2

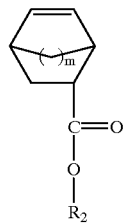

wherein, $R_2$ is an acid labile protecting group; and m is an integer of 1 or 2.

4. The photoresist copolymer of claim 3, wherein $R_2$ is selected from the group consisting of tert-butyl, tetrahydropyran-2-yl, 2-methyl tetrahydropyran-2-yl, tetrahydrofuran-2-yl, 2-methyl tetrahydrofuran-2-yl, 1-methoxypropyl, 1-methoxy-1-methylethyl, 1-ethoxypropyl, 1-ethoxy-1-methylethyl, 1-methoxyethyl, 1-ethoxyethyl, tert-butoxyethyl, 1-isobutoxyethyl and 2-acetylmenth-1-yl.

5. The photoresist copolymer of claim 3, wherein said repeating unit further comprising at least one monomer selected from the group consisting of maleic anhydride and maleimide derivative as a third monomer.

6. The photoresist copolymer of claim 3, wherein said repeating unit further comprising at least one monomer selected from the group consisting of compounds of following Formulas 3 and 4 as a fourth monomer:

Formula 3

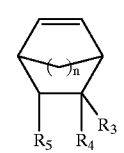

wherein, $R_3$ is selected from the group consisting of —OH, —R—OH and —COOH;

$R_4$ is selected from the group consisting of H, —OH and —R—OH;

R is selected from the group consisting of ($C_1$–$C_{10}$) alkylene, ($C_1$–$C_{10}$) alkylene comprising an ether linkage, ($C_1$–$C_{10}$) alkylene comprising an ester linkage, and ($C_1$–$C_{10}$) alkylene comprising an ketone moiety;

$R_5$ is H, or —COO—R*;

R* is H, or ($C_1$–$C_{10}$) alkyl; and n is an integer of 1 or 2;

Formula 4

$$\underset{R_7}{O} \underset{}{} \underset{R_6}{O}$$

wherein, $R_6$ and $R_7$ are independently selected from the group consisting of ($C_1$–$C_{10}$) alkylene, ($C_1$–$C_{10}$) alkylene comprising an ether linkage, ($C_1$–$C_{10}$) alkylene comprising an ester linkage, and ($C_1$–$C_{10}$) alkylene comprising an ketone moiety.

7. The photoresist copolymer according to claim 3, wherein said repeating unit is selected from the group consisting of:

poly(N-hydroxy-5-norbornene-2,3-dicarboxylic imide/tert-butyl 5-norbornene-2-carboxylate/maleic anhydride/mono-methyl cis-5-norbornene-endo-2,3-dicarboxylate/dibutyl malate);

poly(N-hydroxy-5-norbornene-2,3-dicarboxylic imide/tert-butyl 5-norbornene-2-carboxylate/maleic anhydride/mono-methyl-bicyclo [2.2.2]oct-5-ene-2,3-dicarboxylate/dibutyl malate);

poly(N-hydroxy-5-norbornene-2,3-dicarboxylic imide/tert-butyl 5-norbornene-2-carboxylate/maleic anhydride/5-norbornene-2,2-dimethanol/dibutyl malate);

poly(N-hydroxy-5-norbornene-2,3-dicarboxylic imide/tert-butyl 5-norbornene-2-carboxylate/maleic anhydride/5-norbornene-2-methanol/dibutyl malate);

poly(N-hydroxy-5-norbornene-2,3-dicarboxylic imide/tert-butyl 5-norbornene-2-carboxylate/maleic anhydride/5-norbornene-2-ol/dibutyl malate);

poly(N-hydroxy cis-bicyclo [2.2.2]oct-5-ene-2,3-dicarboxylic imide/bicyclo [2.2.2]oct-5-ene-2-tert-butylcarboxylate/maleic anhydride/bicyclo[2.2.2]oct-5-ene-2,2-dimethanol/dibutyl malate);

poly(N-hydroxy cis-bicyclo [2.2.2]oct-5-ene-2,3-dicarboxylic imide/bicyclo [2.2.2]oct-5-ene-2-tert-butylcarboxylate/maleic anhydride/bicyclo[2.2.2]oct-5-ene-2-methanol/dibutyl malate); and poly(N-hydroxy cis-bicyclo[2.2.2]oct-5-ene-2,3-dicarboxylic imide/bicyclo [2.2.2]oct-5-ene-2-tert-butylcarboxylate/maleic anhydride/bicyclo[2.2.2]oct-5-ene-2-ol/dibutyl malate).

8. The photoresist copolymer of claim 3, wherein the molecular weight of the copolymer ranges from about 3,000 to about 100,000.

9. A photoresist composition comprising a photoresist copolymer of claim 3, a photoacid generator and an organic solvent.

10. The photoresist composition of claim 9, wherein the photoacid generator is selected from the group consisting of diphenyl iodide hexafluorophosphate, diphenyl iodide hexafluoroarsenate, diphenyl iodide hexafluoroantimonate, diphenyl p-methoxyphenyl triflate, diphenyl p-toluenyl triflate, diphenyl p-isobutylphenyl triflate, diphenyl p-tert-butylphenyl triflate, triphenylsulfonium hexafluororphosphate, triphenylsulfonium hexafluoroarsenate, triphenylsulfonium hexafluoroantimonate, triphenylsulfonium triflate, dibutylnaphthylsulfonium triflate and mixtures thereof.

11. The photoresist composition of claim 9, wherein the photoacid generator is present in an amount of 0.1 to 10 wt % of the photoresist polymer employed.

12. The photoresist composition of claim 9, wherein the organic solvent is selected from the group consisting of ethyl 3-ethoxypropionate, methyl 3-methoxypropionate, cyclohexanone, and propyleneglycol methyl ether acetate.

13. The photoresist composition of claim 9, wherein the organic solvent present is in an amount ranging from about 200 to about 1000% by weight of the photoresist polymer.

14. A process for forming a photoresist pattern comprising:
    (a) coating the photoresist composition of claim 9 on a substrate of semiconductor element to form a photoresist film;
    (b) exposing said photoresist film to light using a light source; and
    (c) developing the exposed photoresist film.

15. The process of claim 14, further comprising a baking step before and/or after the exposure step (b).

16. The process of claim 15, wherein the baking step is performed at a temperature ranging from about 10 to about 200° C.

17. The process of claim 14, wherein the light source is a deep ultraviolet light and is selected from the group consisting of ArF, KrF, $F_2$ and EUV, E-beam, X-ray and ion beam.

18. The process of claim 14, wherein said photoresist film is irradiated with light-exposure energy ranging from about 1 to about 30 mJ/cm$^2$.

19. A semiconductor element manufactured by the process according to claim 14.

20. A process for preparing a photoresist copolymer comprising:
    (a) admixing a compound of following Formula 1, a compound of following Formula 2, and, optionally, one or more compounds of maleic anhydride and maleimide derivatives; and
    (b) reacting the resultants at the presence of a polymerization initiator, wherein

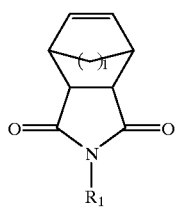

Formula 1 wherein, $R_1$ is —OH or —R—OH;
R is selected from the group consisting of $(C_1–C_{10})$ alkylene, $(C_1–C_{10})$ alkylene comprising an ether linkage, $(C_1–C_{10})$ alkylene comprising an ester linkage, and $(C_1–C_{10})$ alkylene comprising an ketone moiety;
l is an integer of 1 or 2;

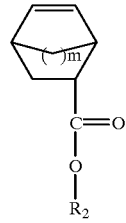

Formula 2 wherein, $R_2$ is an acid labile protecting group; and
m is an integer of 1 or 2.

21. The process of claim 20, wherein step (a) further comprises adding one or more compounds selected from the group consisting of monomers represented by following Formulas 3 and 4:

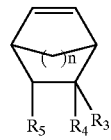

Formula 3 wherein, $R_3$ is selected from the group consisting of —OH, —R—OH and —COOH;
$R_4$ represents H, —OH or —R—OH;
R is selected from the group consisting of $(C_1–C_{10})$ alkylene, $(C_1–C_{10})$ alkylene comprising an ether linkage, $(C_1–C_{10})$ alkylene comprising an ester linkage, and $(C_1–C_{10})$ alkylene comprising an ketone moiety;
$R_5$ is H, or —COO—R*;
R* is H, or $(C_1–C_{10})$ alkyl; and
n is an integer of 1 or 2;

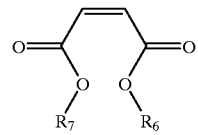

Formula 4 wherein, $R_6$ and $R_7$ are independently selected from the group consisting of $(C_1–C_{10})$ alkylene, $(C_1–C_{10})$ alkylene comprising an ether linkage, $(C_1–C_{10})$ alkylene comprising an ester linkage, and $(C_1–C_{10})$ alkylene comprising an ketone moiety.

22. The process of claim 20, wherein said step (b) is performed in an organic solvent, wherein said organic solvent is selected from the group consisting of tetrahydrofuran, dimethyl formamide, dimethyl sulfoxide, dioxane, methyl ethyl ketone, benzene, toluene and xylene.

23. The process of claim 20, wherein the polymerization initiator is selected from the group consisting of 2,2'-azobisisobutyronitrile (AIBN), benzoyl peroxide, acetyl peroxide, lauryl peroxide and tert-butyl peroxide.

24. A process for preparing a photoresist copolymer comprising:
    (a) dissolving (i) a compound of following Formula 1; and (ii) a compound of following Formula 2 in an organic solvent; and (b) polymerizing the resultant in the presence of a metal catalyst; wherein

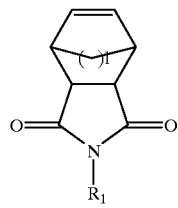

Formula 1 wherein, $R_1$ is —OH or —R—OH;

R is selected from the group consisting of $(C_1–C_{10})$ alkylene, $(C_1–C_{10})$ alkylene comprising an ether linkage, $(C_1–C_{10})$ alkylene comprising an ester linkage, and $(C_1–C_{10})$ alkylene comprising an ketone moiety;

l is an integer of 1 or 2;

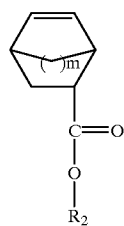

Formula 2 wherein, $R_2$ is an acid labile protecting group; and m is an integer of 1 or 2.

25. The process of claim 24, wherein, in step (a), one or more compounds selected from the group consisting of monomers represented by following Formulas 3 and 4 are additionally added:

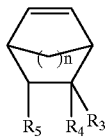

Formula 3 wherein, $R_3$ is selected from the group consisting of —OH, —R—OH and —COOH;

$R_4$ is selected from the group consisting of H, —OH and —R—OH;

R is selected from the group consisting of $(C_1–C_{10})$ alkylene, $(C_1–C_{10})$ alkylene comprising an ether linkage, $(C_1–C_{10})$ alkylene comprising an ester linkage, and $(C_1–C_{10})$ alkylene comprising an ketone moiety;

$R_5$ is H, or —COO—R*;

R* is H, or $(C_1–C_{10})$ alkyl; and n is an integer of 1 or 2;

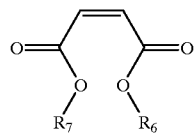

Formula 4 wherein, $R_6$ and $R_7$ are independently selected from the group consisting of $(C_1–C_{10})$ alkylene, $(C_1–C_{10})$ alkylene comprising an ether linkage, $(C_1–C_{10})$ alkylene comprising an ester linkage, and $(C_1–C_{10})$ alkylene comprising an ketone moiety.

26. The process of claim 24, wherein the metal catalyst is allyl palladium chloride.

* * * * *